United States Patent [19]

Abe et al.

[11] Patent Number: 5,213,657
[45] Date of Patent: May 25, 1993

[54] METHOD FOR MAKING UNIFORM THE THICKNESS OF A SI SINGLE CRYSTAL THIN FILM

[75] Inventors: Takao Abe, Annaka; Yasuaki Nakazato, Koushoku; Atsuo Uchiyama, Tobu, all of Japan

[73] Assignee: Shin-Etsu Handotai Kabushiki Kaisha, Japan

[21] Appl. No.: 921,348

[22] Filed: Jul. 29, 1992

[30] Foreign Application Priority Data

Jul. 31, 1991 [JP] Japan .................................. 3-215902
Jul. 31, 1991 [JP] Japan .................................. 3-215903

[51] Int. Cl.$^5$ ......................................... H01L 21/306
[52] U.S. Cl. .................................. 156/631; 156/657; 437/985
[58] Field of Search ............................... 156/631, 657; 148/DIG. 149, DIG. 150; 437/84, 985

[56] References Cited

U.S. PATENT DOCUMENTS 4,824,795  4/1989  Blanchard ........................... 437/985
5,024,723  6/1991  Goesele et al. ...................... 156/657

Primary Examiner—Brian E. Hearn
Assistant Examiner—Linda J. Fleck
Attorney, Agent, or Firm—Townsend, Snider & Banta

[57] ABSTRACT

A Si single crystal thin film is classified according to the thickness into several areas such that the areas where the thin film is thicker is made oxide layer-free and the areas where the thin film is thinner is covered with oxide layer. Then, oxidation is conducted so that the thicker the thin film the lower the Si interface becomes, utilizing the different growth rates of the oxide layer in these areas. The thin film surface with a resulting staircase configuration is then leveled by the subsequent polishing treatment. In other method, oxide layer is formed in such way that the areas with a thicker thin film thickness will have a thinner oxide layer and the areas with a thinner thin film thickness will have a thicker oxide layer, and oxidation is conducted such that the thicker the thin film the lower the Si interface becomes.

16 Claims, 6 Drawing Sheets

METHOD FOR MAKING UNIFORM THE THICKNESS OF A SI SINGLE CRYSTAL THIN FILM

FIELD OF THE INVENTION

This invention relates to a method for making uniform the thickness of a Si single crystal thin film, and in particular to a method for making uniform the thickness of a Si single crystal thin film with an SOI structure.

BACKGROUND OF THE INVENTION

One of the methods for fabricating semiconductor elements is to form a semiconductor layer on a semiconductor substrate with an insulation layer already formed directly on its surface and then fabricate semiconductor elements in the semiconductor layer. In particular, the method in which a so-called SOI (Silicon On Insulator) substrate is used is drawing attention as a method for fabricating semiconductor elements. The SOI substrate includes a Si single crystal layer on an insulation layer. The Si single crystal layer is a thin film with a thickness of several micrometers, and the accuracy of the thickness of the Si single crystal thin film depends on the mechanical accuracy of the surface grinder and the polishing accuracy. Usually, the thickness of the Si single crystal thin film is within ±0.5 micrometers of the target absolute thickness.

However, in order to improve the performance of the semiconductor elements and mass-produce them with good yield, it is desirable to have the dispersion of the local thickness of the semiconductor layer such as a Si single crystal thin film within ±0.1 micrometers of the target absolute thickness. It is impossible to sufficiently improve the performance of the semiconductor elements with the conventional dispersion of ±0.5 micrometers.

SUMMARY OF THE INVENTION

Accordingly, it is an object of the invention to provide a method for reducing the dispersion of the thickness of a Si single crystal thin film with an SOI structure, thus making uniform the thickness of the Si single crystal thin film.

According to the first feature of the invention, a method for making uniform the thickness of a Si single crystal thin film with an SOI structure includes the following steps of:

(a) measuring the surface condition and the thickness unevenness of a Si single crystal thin film by two-dimensional and three-dimensional images to pre-identify closed curve patterns which indicate the thickest peak portions from equal thickness contour curves on the two-dimensional image;

(b) forming a primary Si oxide layer with approximately uniform thickness by the thermal oxidation method on the Si single crystal thin film, masking the surface of the primary Si oxide layer with a masking material except for the closed curve patterns of the peak portions identified in the step (a), removing the primary Si oxide layer only on the surface of the peak portions of the Si single crystal thin film by an etching treatment;

(c) removing the masking material, forming a secondary Si oxide layer which is deeper than the previous boundary between the primary Si oxide layer and the Si single crystal thin film on the portions of the Si single crystal thin film where the primary Si oxide layer has been removed, and removing the primary and secondary Si oxide layers by an etching treatment;

(d) repeating the steps (a) to (c) as necessary; and (e) polishing the Si single crystal thin film surface to have a mirror finish.

According to the second feature of the invention, a method for making uniform the thickness of a Si single crystal thin film with an SOI structure includes the following steps of:

(a) classifying the surface of a Si single crystal thin film according to the thickness of the Si single crystal thin film into n (n is an integer equal or greater than two) areas in order of thickness from the first area to the n-th area;

(b) forming a primary Si oxide layer with approximately uniform thickness on the Si single crystal thin film by the thermal oxidation method;

(c) masking the surface of the primary Si oxide layer with a masking material except for the first area classified in the step (a) as having the thickest thickness of the Si single crystal thin film, and removing the surface of the primary Si oxide layer of the first area down to a certain depth by an etching treatment;

(d) repeating the step (c) for each area from the second to the n-th thickness areas to create n level gaps on the primary Si oxide layer formed in the step (b);

(e) forming a secondary Si oxide layer on the Si single crystal thin film on which the primary Si oxide layer with the level gaps still remains to form new level gap layers corresponding to the level gaps on the primary Si oxide layer;

(f) removing the remaining primary and secondary Si oxide layers by an etching treatment;

(g) repeating the steps (a) to (f) as necessary; and (h) polishing the Si single crystal thin film surface to have a mirror finish.

The measuring step (a) in the first feature of the invention and the classifying step (a) in the second feature of the invention may be carried out by the multiple light interference method. The masking material used in the first and second features of the invention may be a synthetic resin film which is chemically stable in the etching solution used in the etching treatment, such as a one-sided adhesive synthetic resin sheet or a synthetic resin coating which has been cured after application.

Next, the mechanism of the invention will be explained. The growth of Si thermal oxide layer, in terms of its relationship to the thickness Tox [micrometers] of the oxide layer and the oxidation time t [min] is expressed by the following equation (except when the oxidation temperature is low):

$$T_{ox}^2 = C_1 t \quad (C_1 \text{ is a constant}) \quad (1)$$

In the case of dry oxidation, the following equation can be used for calculation when the oxidation temperature T is 1100° C. or higher:

$$T_{ox}^2 = 21.2 t \cdot \exp(-Ea/kT) \quad (2)$$

where Ea is the activation energy, which is 1.33 eV in this case.

In the case of steam oxidation, the following equation can be used for calculation when the oxidation temperature T is 1100° C. or higher and the treatment time t > 5 minutes:

$$T_{ox}^2 = 7.6 t \cdot \exp(-Ea/kT) \quad (3)$$

In this case, Ea is 0.80 eV.

Therefore, on the Si single crystal thin film of the SOI substrate, when portions with and without the Si oxide layer are formed in advance and then additional oxide layer is formed by oxidation treatment on the substrate, the resulting depth-wise relative position of the interface between the Si oxide layer and the Si single crystal thin film after the oxidation treatment, measured from the surface or interface of the thin film just before the oxidation treatment, is lower for the portions without the oxide layer than for the portions with the oxide layer.

That is, since the growth rate of the oxide layer in the area with pre-existing oxide layer is different from the rate in the area without pre-existing oxide layer, the depth of the Si single crystal thin film layer consumed along with the growth of the oxide layer is also different between these areas. As a result, Si in the area without oxide layer is consumed more, and the interface between Si oxide layer and the Si single crystal thin film is lowered proportionally, so that the thickness of the Si single crystal thin film in the area becomes thinner. Therefore, if the area where the Si single crystal thin film is relatively thick is made to be an area with thinner oxide layer as residual and thin area with relatively thin of the film is etched to have thicker oxide layer, then oxidation treatment will consume more Si in the area with the thinner oxide layer, i.e. the thicker film area, and thus the area becomes thinner in the thickness of the film, as for the film.

Therefore, by classifying the thin film into several areas and repeatedly conducting oxidation treatment on thicker areas which do not have oxide layer, as described above, it is possible to make the film thickness relatively thin and make uniform the thickness of the entire Si single crystal thin film.

On the other hand, if Si oxide layers with different thicknesses are formed on different portions, and oxidation treatment is conducted on the substrate to form additional oxide layer, then the depth-wise downward displacement of the interface between the Si oxide layer and the Si single crystal thin film layer is smaller for portions with thicker oxide.

That is, since the growth rate of the oxide layer in the area with thick pre-formed oxide layer is different from the rate in the area with thin pre-formed oxide layer, the depth of the single crystal thin film layer consumed along with the growth of the oxide layer is also different between these areas. As a result, Si in the area with thin preformed oxide layer is consumed more, and the interface between Si oxide layer and the Si single crystal thin film is lowered proportionally, so that the thickness of the Si single crystal thin film in the area becomes thinner. Therefore, if the area where the Si single crystal thin film is relatively thick is made to be an area with thin oxide layer and the area where the Si single crystal thin film is relatively thin is made to be an area with thick oxide layer, then subsequent oxidation treatment will consume more Si in the area with thin oxide layer, i.e. the thicker area, and thus the area becomes thinner.

Therefore, by classifying the thin film into several areas, forming oxide layer in such way that the areas with thicker thin film thicknesses have thinner oxide layer, and conducting oxidation treatment in this condition, it is possible to make the thin film thickness relatively thin for originally thicker areas, and thus make uniform the thickness of the entire Si single crystal thin film.

BRIEF DESCRIPTION OF THE DRAWINGS

This invention will be explained in more detail in conjunction with appended drawings, wherein.

DESCRIPTION OF THE PREFERRED EMBODIMENTS

Preferred embodiments of this invention are described below by referring to the attached drawings.

Figure 1A:
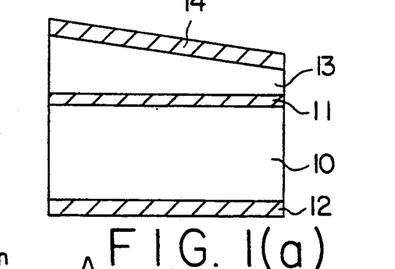
FIG. 1 is a process diagram showing a method for making uniform the thickness of a Si single crystal thin film in a first preferred embodiment according to the invention.

First, a method for making uniform a thickness a Si single crystal thin film in the first preferred embodiment will be explained. In FIG. 1(a), oxide layers 11 and 12 of the prescribed thickness are formed on a base wafer 10 by thermal oxidation. A bond wafer 13 is bonded onto the oxide layer 11. The thickness of the bond wafer 13 which is a Si single crystal thin film is not uniform with, for example, the left side being thicker than the right side as shown in the drawing. Such nonuniformity of the thin film thickness shows up as interference fringes when observing the wafer. This unevenness of the thin film thickness is measured with a thickness meter such as a Nano-spec, and the thin film thickness nonuniformity of the bond wafer 13 is depicted by contours every 0.06 micrometers, for example. In this embodiment, in order to simplify the description, let us assume that the Si single crystal thin film is divided in terms of thickness into three areas by two contours every 0.06 micrometers.

Figure 1B:
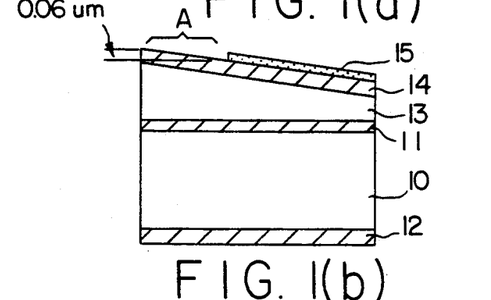
Figure 1C:
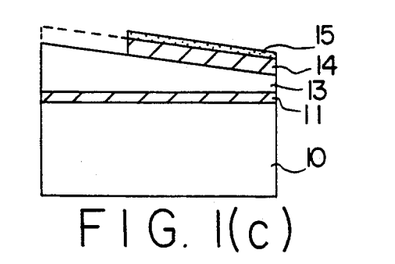

In the method of this embodiment, an oxide layer 14 with a thickness of 0.4 micrometers is formed on the upper surface of the bond wafer 13 (FIG. 1(a)). Then, all areas except for the thickest area A of the bond wafer 13, based on the measurement results mentioned earlier, are masked by a masking material 15 (FIG. 1(b)). Then, the wafer is etched with the etching solution (HF aqueous solution) to remove the oxide layer on the unmasked area A (FIG. 1(c)).

Figure 1D:
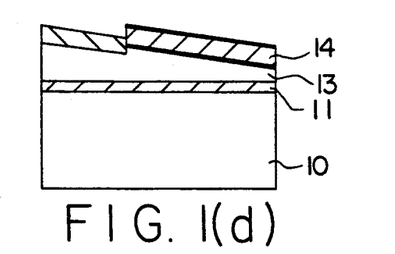

Next, after removing the masking material 15, an oxidation treatment is conducted under the conditions which will form oxide layer with a thickness of 0.2 micrometers on the area A of the bond wafer 13 which is not covered with the oxide layer (FIG. 1(d)). While oxide layer with a thickness of 0.2 micrometers is formed on the area A, the thickness of the newly formed oxide layer on the other areas is less than 0.2 micrometers, because there is the oxide layer with a thickness of 0.4 micrometers already formed on these areas. Therefore, downward displacement of the interface between Si oxide and the Si single crystal thin film caused by oxidation is less for these areas than for the area A. As a result, an interface level gap is created between the area A and the other areas.

Figure 1E:
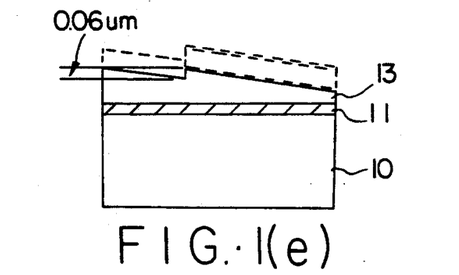

Next, removing the entire oxide layer with etching results in a level gap between the area A and the other areas on the surface of the bond wafer 13 (FIG. 1(e)). The area A on the bond wafer 13 is now 0.27 micrometers thinner than its original thickness, while the other areas are 0.21 micrometers thinner than their original thicknesses, thus the level gap mentioned earlier is 0.06 micrometers. Therefore, the area A has become 0.06 micrometers relatively thinner at its boundary to the other areas, thus improving the nonuniformity of the thin film thickness.

Figure 1F:
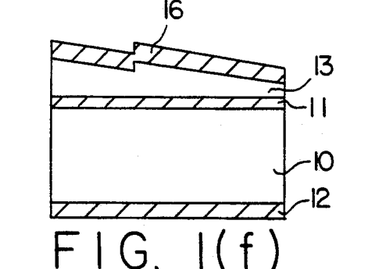
Figure 1G:
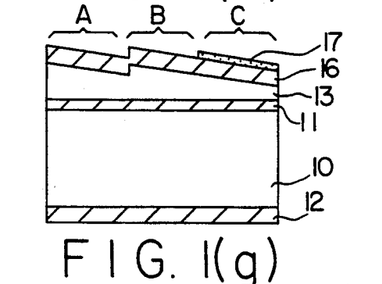
Figure 1H:
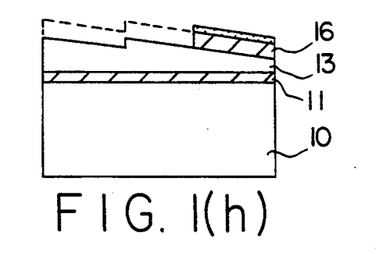

Next, an oxide layer 16 with a thickness of 0.4 micrometers is formed again on the upper surface of the bond wafer 13 (FIG. 1(f)). Then, the oxide layer 16 on the thinnest area C on the bond wafer 13 is masked with a masking material 17, leaving the area A and the next thinnest area B unmasked (FIG. 1(g)). Then, the wafer is etched with the etching solution (HF aqueous solution) to remove the oxide layer on the unmasked areas A and B (FIG. 1(h)).

Figure 1I:
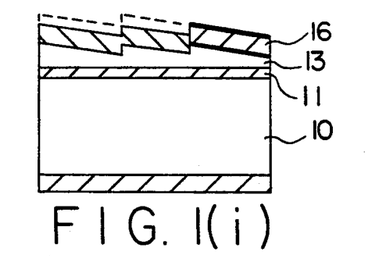

Next, after removing the masking material 17, an oxidation treatment is conducted under the conditions which will form oxide layer with a thickness of 0.2 micrometers on the areas A and B on the bond wafer 13 which are not covered with the oxide layer (FIG. 1(i)). While oxide layer with a thickness of 0.2 micrometers is formed on the areas A and B, similar to those in FIG. 1(d), downward displacement of the interface between the Si oxide and the Si single crystal thin film caused by oxidation is less for the area C than for the areas A and B, because there is the oxide layer with a thickness of 0.4 micrometers already formed on the area C. As a result, an interface level gap is created between the areas B and C.

Figure 1J:
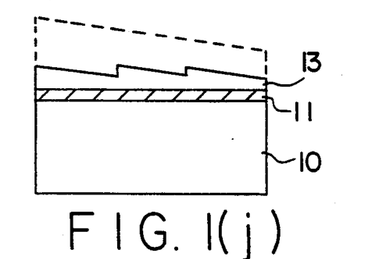

Next, removing the entire oxide layer with etching results in two level gaps: one is the level gap between the areas B and C created by the previous process, and the other is the already existing level gap between the areas A and B (FIG. 1(j)). Each level gap is 0.06 micrometers. Therefore, the thickness of the bond wafer 13 is made uniform in a staircase fashion.

The level gaps created on the surface can subsequently be leveled by mirror-polishing. Normally, polishing away ten times the thickness of the maximum single level gap is enough. For this embodiment, polishing away 0.6 micrometers or more would be sufficient.

Figure 2A:
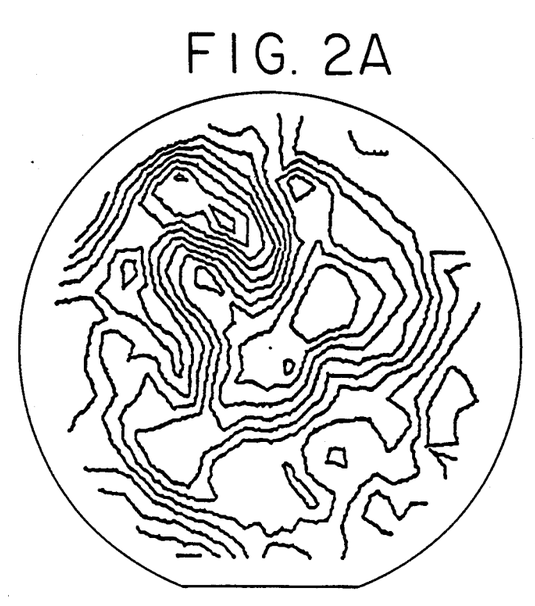
FIGS. 2A and 2B are two-dimensional and three dimensional diagrams respectively showing by contours the surface condition of the SOI substrate before the thin film thickness making uniform treatment in the first preferred embodiment according to the invention.
Figure 2B:
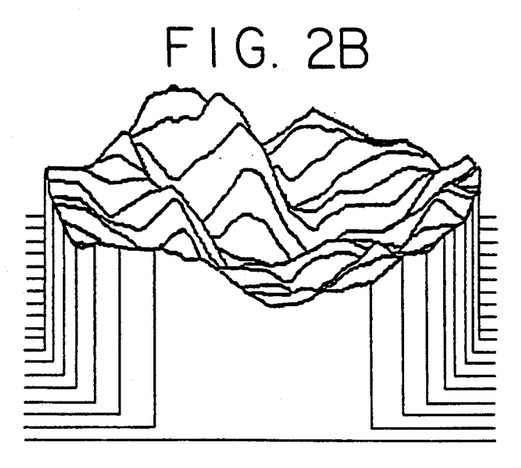
Figure 3A:
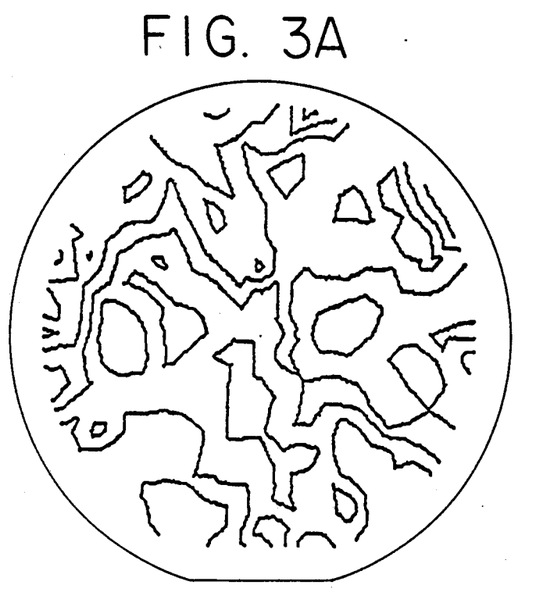
FIGS. 3A and 3B are two-dimensional and three-dimensional diagrams respectively showing by contours the surface condition of the SOI substrate after the thin film thickness making uniform treatment in the first preferred embodiment according to the invention.
Figure 3B:
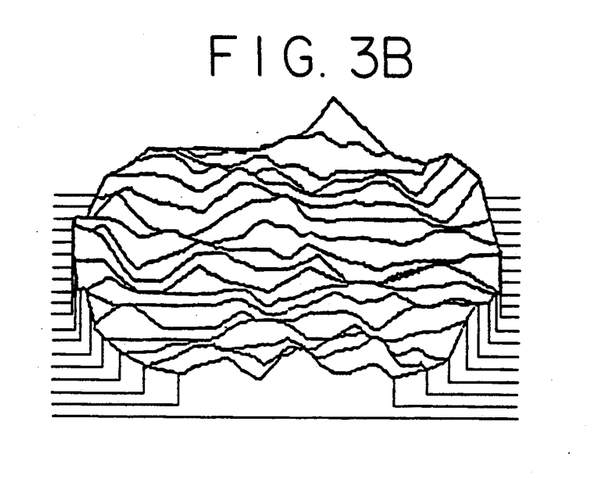

FIGS. 2A and 2B show by contours the surface condition of the SOI substrate before the thin film thickness making uniform treatment, in which FIG. 2A is a two-dimensional diagram and FIG. 2B is a three-dimensional diagram. FIGS. 3A and 3B show by contours the surface condition of the SOI substrate after the thin film thickness making uniform treatment, in which FIG. 3A is a two-dimensional diagram and FIG. 3B is a three-dimensional diagram. As shown in these diagrams, the wafer has narrowly spaced contours and widely dispersed thin film thickness before the thin film thickness making uniform treatment, but after the thin film thickness making uniform treatment the wafer has contours more widely spaced and the dispersion of the thin film thickness is smaller. It is confirmed that the dispersion of the thin film thickness of the wafer is improved from 0.77 micrometers to 0.38 micrometers with the method described above.

Figure 4A:
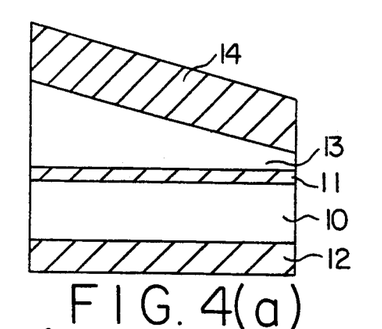
FIG. 4 is a process diagram showing a method for making uniform the thickness of a Si single crystal thin film in a second preferred embodiment according to the invention.

Next, a method for making uniform a thickness of a Si single crystal thin film in the second preferred embodiment will be explained. In the second preferred embodiment, like elements are given like reference numerals in the first preferred embodiment. In FIG. 4(a), oxide layers 11 and 12 of the prescribed thickness are formed on a base wafer 10 by thermal oxidation. A bond wafer 13 is then bonded onto the oxide layer 11. The thickness of the bond wafer 13 is not uniform with the left side being thicker than the right side as shown in the drawing like in the first preferred embodiment. The thickness nonuniformity of the bond wafer 13 is depicted by contours every 0.06 micrometers, and in order to simplify the description, let us assume that the film is divided in terms of thickness into five areas by contours every 0.06 micrometers.

In the method of this embodiment, an oxide layer 14 with a thickness of 1.0 micrometers is formed on the upper surface of the bond wafer 13 (FIG. 4(a)).

Figure 4B:
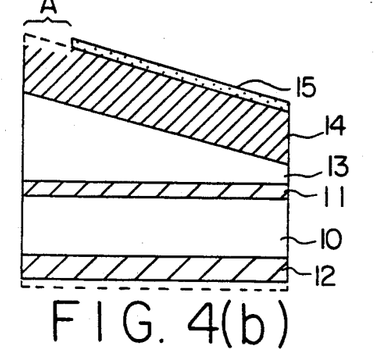

Next, all areas except for the thickest area A of the bond wafer 13, based on the measurement results mentioned earlier, are masked with a masking material 15. This wafer is then etched with the etching solution (HF aqueous solution) to remove 0.17 micrometers thickness of the oxide layer on the unmasked area A (FIG. 4(b)).

Figure 4C:
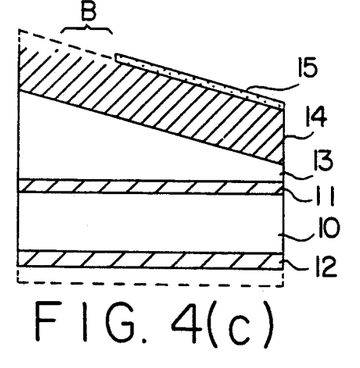

Next, all areas except for the area A and the next thickest area B of the bond wafer 13 are re-masked with the masking material 15. The wafer is then etched with the etching solution (HF aqueous solution) to remove 0.18 micrometers thickness of the oxide layer on the unmasked areas A and B (FIG. 4(c)).

Figure 4D:
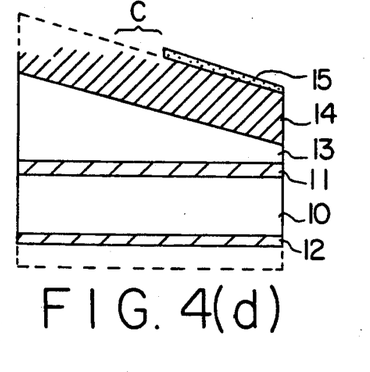

Next, in the same manner as described above, all areas except for the areas A, B and the next thickest area C of the bond wafer 13 are re-masked with the masking material 15. The wafer is then etched with the etching solution (HF aqueous solution) to remove 0.25 micrometers thickness of the oxide layer on the unmasked areas A, B and C (FIG. 4(d)).

Figure 4E:
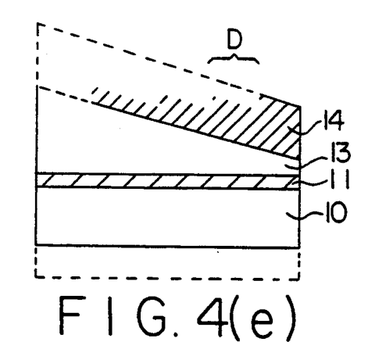

Next, in the same manner as described above, all areas except for the areas A, B, C and the next thickest area D of the bond wafer 13 are re-masked with the masking material 15. The wafer is then etched with the etching solution (HF aqueous solution) to remove 0.40 micrometers thickness of the oxide layer on the unmasked areas A, B, C and D. Then the masking material is removed (FIG. 4(e)). The resulting condition is such that the oxide layer becomes thicker from the area A to the area E in steps, and, in particular, the area A has almost no oxide layer.

Figure 4F:
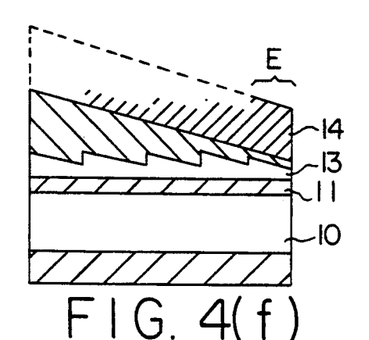

Oxidation treatment is conducted on the wafer under conditions which form oxide layer with a thickness of 1.0 micrometers on the area A, which does not have oxide layer (FIG. 4(f)).

Figure 4G:
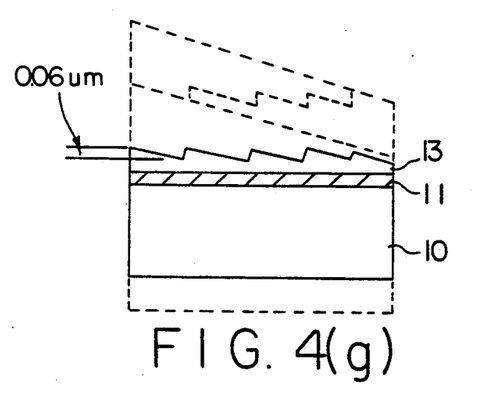

Next, the entire area of the oxide layer is etched with the etching solution (HF aqueous solution) (FIG. 4(g)). While oxide layer with a thickness of 1.0 micrometers is formed on the area A, other areas, having pre-formed oxide layer with prescribed thicknesses, have newly formed oxide layer thinner than 1.0 micrometers. That is, areas with thicker oxide layer, i.e. areas where the bond wafer 13 is thinner, have less amount of oxide growth. Therefore, the interface between the Si oxide and the Si single crystal thin film sinks lower in areas where the bond wafer 13 was originally thicker, thus making uniform the thickness of the entire bond wafer 13 in a staircase fashion.

The level gaps created on the surface can subsequently be leveled by mirror-polishing. Normally, polishing away ten times the thickness of the maximum single level gap is enough. For this embodiment, polishing away 0.6 micrometers or more would be sufficient.

Figure 5A:
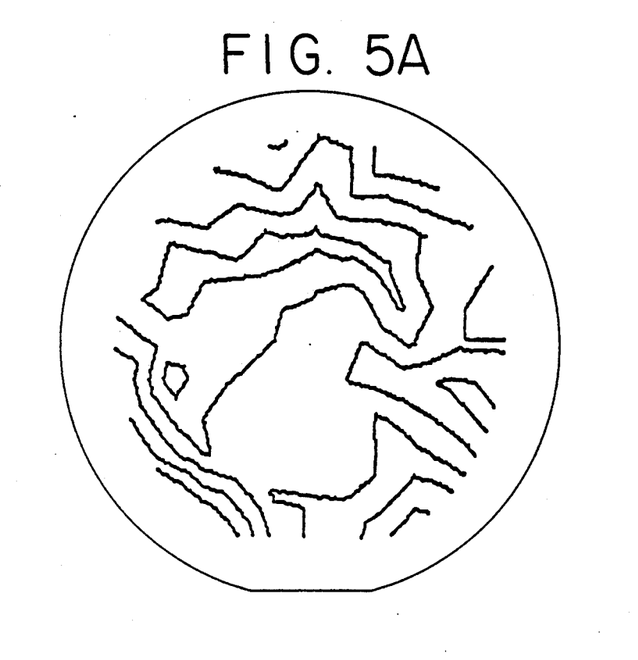
FIGS. 5A and 5B are two-dimensional and three dimensional diagrams respectively showing by contours the surface condition of the SOI substrate before the thin film thickness making uniform treatment in the second preferred embodiment according to the invention.
Figure 5B:
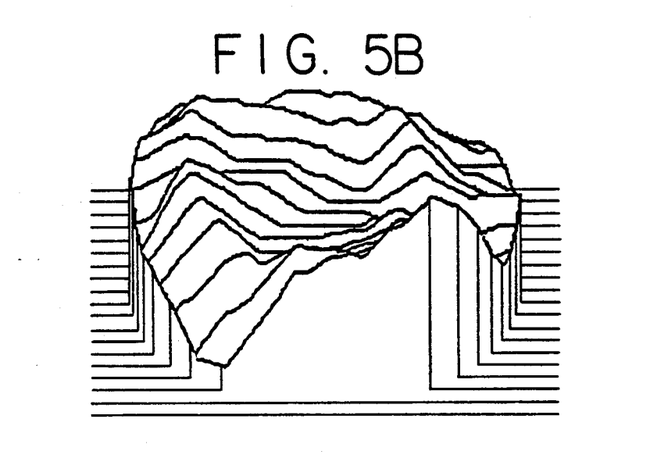
Figure 6A:
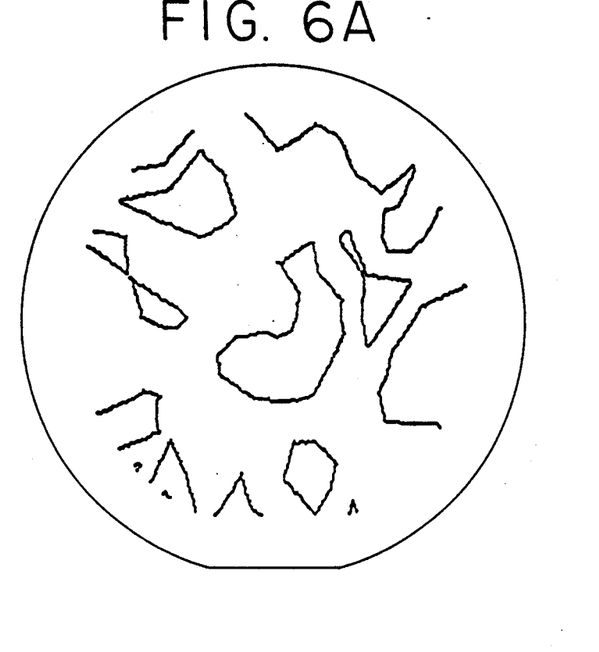
FIGS. 6A and 6B are two-dimensional and three-dimensional diagrams respectively showing by contours the surface condition of the SOI substrate after the thin film thickness making uniform treatment in the second preferred embodiment according to the invention.
Figure 6B:
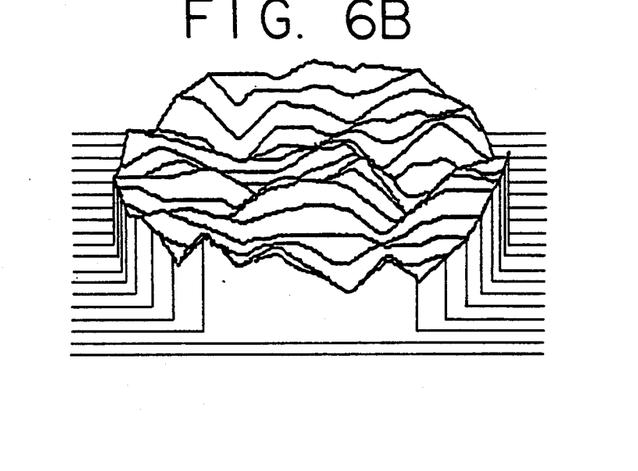

FIGS. 5A and 5B show by contours the surface condition of the SOl substrate before the thin film thickness making uniform treatment, in which FIG. 5A is a two-dimensional diagram and FIG. 5B is a three-dimensional diagram. FIGS. 6A and 6B show by contours the surface condition of the SOl substrate after the thin film thickness making uniform treatment, in which FIG. 6A is a two-dimensional diagram and FIG. 6B is a three-dimensional diagram. As shown in these diagrams, the wafer has narrowly spaced contours and widely dispersed thin film thickness before the thin film thickness making uniform treatment, but after the thin film thickness making uniform treatment the wafer has contours more widely spaced and the dispersion of the thin film thickness is smaller. It is confirmed that the dispersion of the thin film thickness of the wafer is improved from 0.45 micrometers to 0.22 micrometers with the method described above.

In these embodiments, it is not necessary to limit the thickness difference between the contours to 0.06 micrometers. This difference should be determined based on the required accuracy. By subdividing the areas even more as necessary and repeating the process described above, it is possible to improve the accuracy of the film thickness uniformization of the bond wafer 13.

As described thus far, this invention makes it possible to reduce the dispersion of the thickness of a Si single crystal thin film with an SOl structure and thereby make uniform the thickness of the Si single crystal thin film.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A method for making uniform the thickness of a Si single crystal thin film, comprising the steps of:
   (a) measuring the surface condition and the thickness unevenness of a Si single crystal thin film by two-dimensional and three-dimensional images to pre-identify closed curve patterns which indicate the thickest peak portions from equal thickness contour curves on said two-dimensional image;
   (b) forming a primary Si oxide layer with approximately uniform thickness by the thermal oxidation method on said Si single crystal thin film, masking the surface of said primary Si oxide layer with a masking material except for said closed curve patterns of said peak portions identified in said step (a), removing said primary Si oxide layer only on the surface of said peak portions of said Si single crystal thin film by an etching treatment;
   (c) removing said masking material, forming a secondary Si oxide layer which is deeper than the previous boundary between said primary Si oxide layer and said Si single crystal thin film on the portions of said Si single crystal thin film where said primary Si oxide layer has been removed, and removing said primary and secondary Si oxide layers by an etching treatment;
   (d) repeating said steps (a) to (c) as necessary; and
   (e) polishing said Si single crystal thin film surface to have a mirror finish.

2. A method for making uniform the thickness of a Si single crystal thin film, according to claim 1:
   wherein said measuring step (a) is carried out by the multiple light interference method.

3. A method for making uniform the thickness of a Si single crystal thin film, according to claim 1:
   wherein said masking material is a synthetic resin film which is chemically stable in an etching solution used in said etching treatment.

4. A method for making uniform the thickness of a Si single crystal thin film, according to claim 1:
   wherein said masking material is a one-sided adhesive synthetic resin sheet.

5. A method for making uniform the thickness of a Si single crystal thin film, according to claim 1:
   wherein said masking material is a synthetic resin coating which has been cured after application.

6. A method for making uniform the thickness of a Si single crystal thin film, according to claim 2:
   wherein said masking material is a synthetic resin film which is chemically stable in an etching solution used in said etching treatment.

7. A method for making uniform the thickness of a Si single crystal thin film, according to claim 2:
   wherein said masking material is a one-sided adhesive synthetic resin sheet.

8. A method for making uniform the thickness of a Si single crystal thin film, according to claim 2:
   wherein said masking material is a synthetic resin coating which has been cured after application.

9. A method for making uniform the thickness of a Si single crystal thin film, comprising the steps of:
   (a) classifying the surface of a Si single crystal thin film according to the thickness of said Si single crystal thin film into n (n is an integer equal or greater than two) areas in order of thickness from the first area to the n-th area;
   (b) forming a primary Si oxide layer with approximately uniform thickness on said Si single crystal thin film by the thermal oxidation method;
   (c) masking the surface of said primary Si oxide layer with a masking material except for the first area classified in said step (a) as having the thickest thickness of said Si single crystal thin film, and removing the surface of said primary Si oxide layer of said first area down to a certain depth by an etching treatment;
   (d) repeating said step (c) for each area from the second to the n-th thickness areas to create n level gaps on said primary Si oxide layer formed in said step (b);
   (e) forming a secondary Si oxide layer on said Si single crystal thin film on which said primary Si oxide layer with said level gaps still remains to form new level gap layers corresponding to said level gaps on said primary Si oxide layer;

(f) removing said remaining primary and secondary Si oxide layers by an etching treatment;

(g) repeating said steps (a) to (f) as necessary; and (h) polishing said Si single crystal thin film surface to have a mirror finish.

10. A method for making uniform the thickness of a Si single crystal thin film, according to claim 9:
wherein said classifying step (a) is carried out by the multiple light interference method with two-dimensional and three-dimensional images.

11. A method for making uniform the thickness of a Si single crystal thin film, according to claim 9:
wherein said masking material is a synthetic resin film which is chemically stable in an etching solution used in said etching treatment.

12. A method for making uniform the thickness of a Si single crystal thin film, according to claim 9:
wherein said masking material is a one-sided adhesive synthetic resin sheet.

13. A method for making uniform the thickness of a Si single crystal thin film, according to claim 9:
wherein said masking material is a synthetic resin coating which has been cured after application.

14. A method for making uniform the thickness of a Si single crystal thin film, according to claim 10:
wherein said masking material is a synthetic resin film which is chemically stable in an etching solution used in said etching treatment.

15. A method for making uniform the thickness of a Si single crystal thin film, according to claim 10:
wherein said masking material is a one-sided adhesive synthetic resin sheet.

16. A method for making uniform the thickness of a Si single crystal thin film, according to claim 10:
wherein said masking material is a synthetic resin coating which has been cured after application.

* * * * *